(12) United States Patent
Han

(10) Patent No.: US 6,489,822 B2
(45) Date of Patent: Dec. 3, 2002

(54) DELAY LOCKED LOOP WITH DELAY CONTROL UNIT FOR NOISE ELIMINATION

(75) Inventor: Jong-Hee Han, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 09/747,886

(22) Filed: Dec. 22, 2000

(65) Prior Publication Data

US 2001/0014048 A1 Aug. 16, 2001

(30) Foreign Application Priority Data

Dec. 30, 1999 (KR) .......................................... 99-66913

(51) Int. Cl.[7] ................................................ H03L 7/06
(52) U.S. Cl. ....................................... 327/158; 327/151
(58) Field of Search ................................. 327/158, 151, 327/153, 160, 161, 162, 163, 270, 265, 273, 286, 147; 375/226, 373, 374; 331/1 R, 25; 377/64, 69; 365/233

(56) References Cited

U.S. PATENT DOCUMENTS 6,002,281 A  * 12/1999 Jones et al. .................. 327/161
6,137,327 A  * 10/2000 Schnell ........................ 327/158
6,137,328 A  * 10/2000 Sung ............................ 327/158
6,194,916 B1 *  2/2001 Nishimura et al. ......... 327/147
6,212,126 B1 *  4/2001 Sakamoto ................... 365/133

* cited by examiner

Primary Examiner—Timothy P. Callahan
Assistant Examiner—Linh Nguyen
(74) Attorney, Agent, or Firm—Townsend and Townsend and Crew LLP

(57) ABSTRACT

Disclosed is a delay locked loop (DLL) for use in a semiconductor memory device, which has the ability to reduce or eliminate a power supply noise, a random noise or other irregular noise. The DLL includes a controllable delay modification unit for delaying a clock signal fed thereto to produce a time-delayed signal, a comparator for comparing the time-delayed signal from the modification block and a reference signal, and determining an addition or subtraction of the time delay according to the compared result to produce a corresponding output signal, and a delay control unit for counting the number that the corresponding output signal is activated, and producing a signal for controlling the addition or the subtraction of the time delay to the modification unit, if the counted value satisfies a predetermined condition.

20 Claims, 7 Drawing Sheets

DELAY LOCKED LOOP WITH DELAY CONTROL UNIT FOR NOISE ELIMINATION

FIELD OF THE INVENTION

The present invention relates to a semiconductor memory device; and, more particularly, of a delay locked loop having the ability to drastically eliminate noise.

DESCRIPTION OF THE PRIOR ART

In general, a delay locked loop (DLL) circuit reduces a skew between a clock signal and data or between an external clock and an internal clock, which is used in synchronizing an internal clock of a synchronous memory to an external clock without incurring any error. Specifically, a timing delay is incurred when an external clock is used internally to a system, and the delay locked loop controls the timing delay to synchronize the internal clock to the external clock.

FIG. 1 is a schematic block diagram of a conventional delay locked loop.

A clock signal Clock_1 is input to a controllable delay modification unit 100 which delays the input signal by a certain time period and produces a time-delayed signal Delayed_clock to a comparator 110. The comparator 110 compares the time-delayed signal Delayed clock and a reference signal Clock_reference, and determines if the time delay should be increased (added) or decreased (subtracted), to produce one of an addition signal Add_delay or a subtraction signal Subtract_delay. The addition signal Add_delay or the subtraction signal Subtract-delay output from the comparator 110 is fed back to the controllable delay modification unit 100. Based on the addition signal or the subtraction signal, the controllable delay modification unit 100 modifies the time delay until the reference signal Clock_reference and the time-delayed signal Delayed_clock are synchronous in phase.

As mentioned above, the prior art is designed so that the comparator 110 determines if the time delay fed thereto from the controllable delay modification unit 100 should be increased or decreased and returns the result to the controllable delay modification unit 100 to thereby allow the time delay to be adjusted.

However, the prior art has a drawback that it is very sensitive to a power supply noise, random noise, radiation noise or other irregular noise. That is, the erroneous determination of the comparator 110 due to such noises causes an output signal to be fed back to the controllable delay modification unit 100 to be erroneous. As a result, the controllable delay modification unit 100 controls the time delay based on the erroneous signal, resulting in an unintended problem.

SUMMARY OF THE INVENTION

It is, therefore, a primary object of the present invention to provide a delay locked loop having the ability to reduce or eliminate a power supply noise, a random noise or other irregular noise.

In accordance with a preferred embodiment of the present invention, there is provided a delay locked loop for use on a semiconductor memory device, which comprises: a controllable delay modification unit for delaying a clock signal fed thereto to produce a time-delayed signal; a comparator for comparing the time-delayed signal from the modification unit and a reference signal, and determining an addition or subtraction of the time delay according to the compared result to produce a corresponding output signal; and a delay control unit for counting occurrences of the corresponding output signal and producing a signal for controlling the addition or the subtraction of the time delay to the controllable delay modification unit, if the counted value is larger than a predetermined value.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
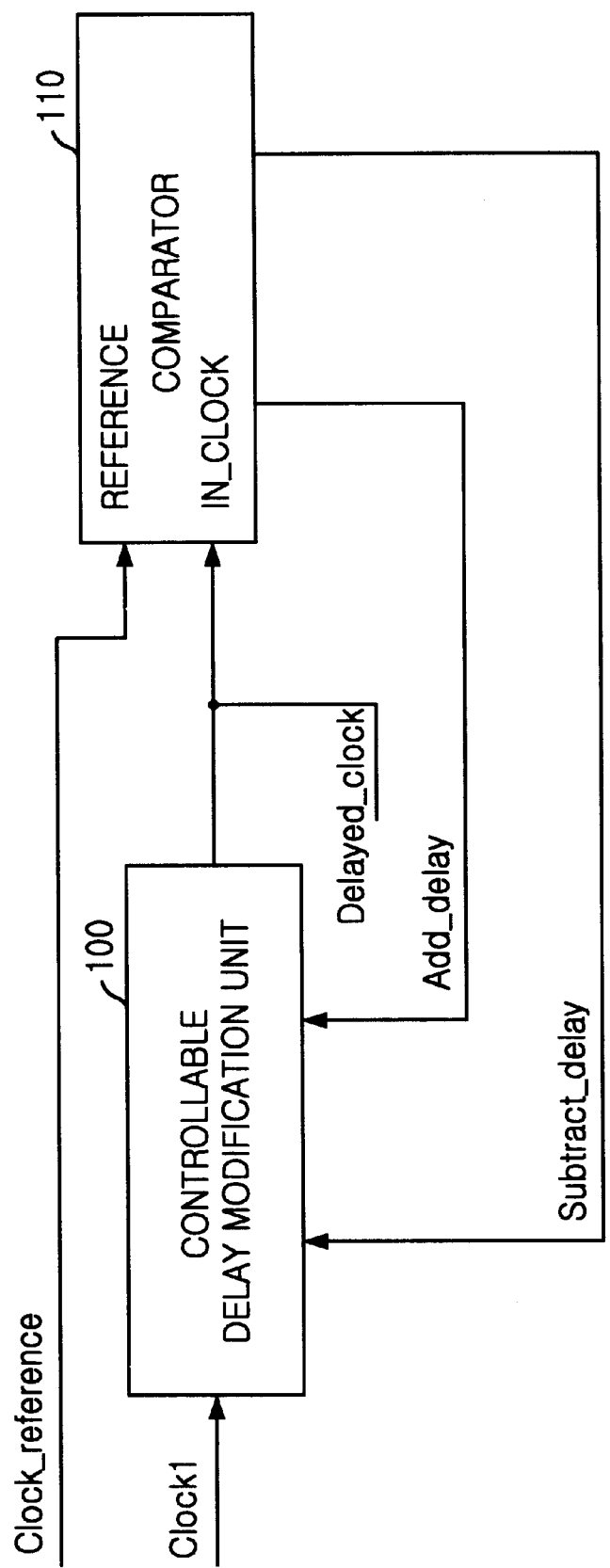
FIG. 1 shows a schematic block diagram of a conventional delay locked loop.
Figure 2:
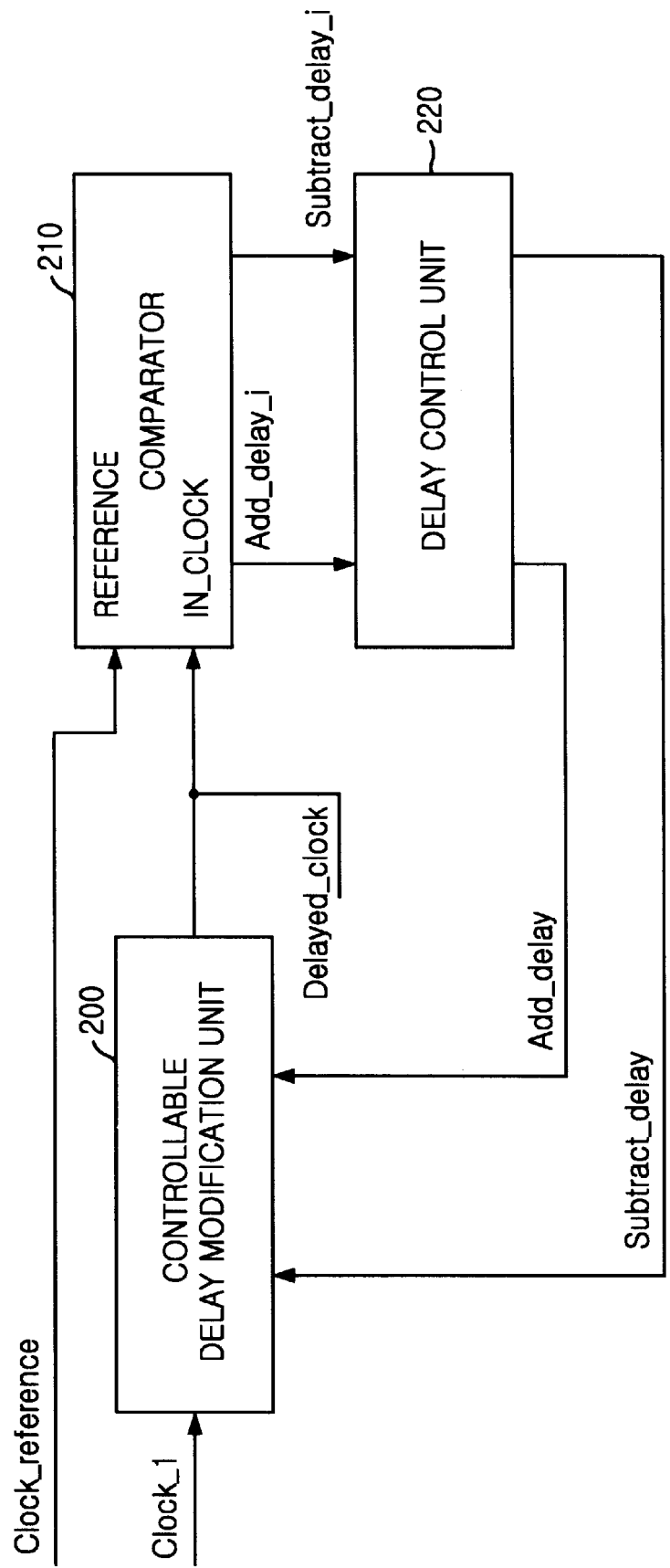
FIG. 2 is a schematic block diagram of a delay locked loop incorporating a delay control unit therein in accordance with preferred embodiments of the present invention.

There is shown in FIG. 2 a schematic block diagram of a delay locked loop incorporating a delay control unit therein in accordance with preferred embodiments of the present invention.

In FIG. 2, a clock signal Clock_1 is input to a controllable delay modification unit 200, which produces a time-delayed signal Delayed_clock to a comparator 210. The comparator 210 compares the time-delayed signal Delayed_clock from the controllable delay modification unit 200 and a reference signal Clock_reference, each being input thereto via terminals IN_CLOCK and REFERENCE respectively, and determines whether a time delay should be increased or decreased. The output of the comparator 210 is an addition signal Add_delay_i representing the increase of the time delay or a subtraction signal Sub_delay_i representing the decrease of the time delay, which is forwarded to a delay control unit 220.

The delay control unit 220 handles an erroneous delay determination that may be induced by noise introduced by a power supply or a system. Specifically, the delay control unit 220 controls the controllable delay modification unit 200 only if at least two consecutive determinations for the time delay satisfy a predetermined condition. When the condition is satisfied, the delay control unit 220 outputs one of the addition signal Add_delay_i and the subtraction signal Sub_delay_i provided thereto from the comparator 210 to the controllable delay modification unit 200. Thus, the controllable delay modification unit 200 increases or decreases the time delay based on the signal from the delay control unit 220.

Figure 3:
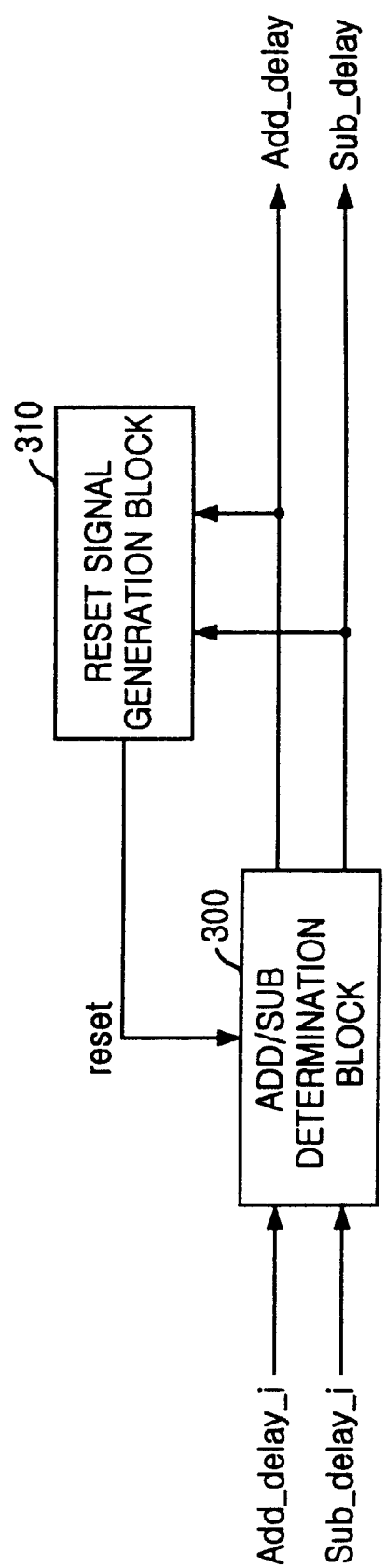
FIG. 3 is a detailed block diagram of the delay control unit in accordance with a preferred embodiment of the present invention.

FIG. 3 is a detailed block diagram of the delay control unit in accordance with a preferred embodiment of the present invention.

The delay control unit in accordance with a preferred embodiment of the present invention includes an addition/subtraction determination block 300 and a reset signal generation block 310. The addition signal Add_delay_i and the subtraction signal Sub_delay_i from the comparator 210 shown in FIG. 2 are relayed to the addition/subtraction determination block 300 which counts an input signal to produce one of signals Add_delay and Sub_delay for adjusting the time delay. The signal Add_delay represents that the time delay is in need of increase and the signal Sub_delay represents that the time delay is in need of decrease. The signals Add_delay and Sub delay are relayed to the reset signal generation block 310, which produces a reset signal for initializing the addition/subtraction determination block 300.

The addition/subtraction determination block 300 may be implemented with a counter. Specifically, if the addition signal Add_delay_i is input to the addition/subtraction determination block 300, the addition/subtraction determination block 300 increases the counter by one. Similarly, if the subtraction signal Sub_delay_i is input, the addition/subtraction determination block 300 decreases the counter by one. Thus, the addition/subtraction determination block 300 produces the signal Add_delay if the counted value reaches a first predetermined value, and produces the signal Sub_delay if it reaches a second predetermined value.

Figure 4:
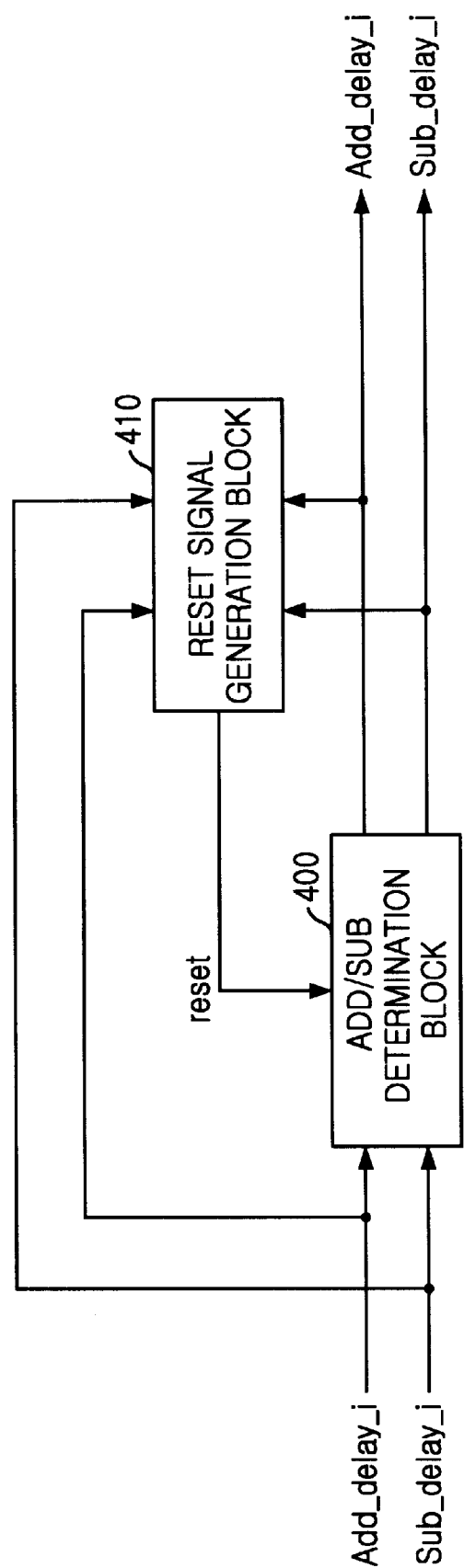
FIG. 4 is a detailed block diagram of the delay control unit in accordance with another preferred embodiment of the present invention.

FIG. 4 is a detailed block diagram of the delay control unit in accordance with another preferred embodiment of the present invention.

The delay control unit in accordance with another preferred embodiment of the present invention includes an addition/subtraction determination block 400 and a reset signal generation block 410. The addition signal Add_delay_i and the subtraction signal Sub_delay_i from the comparator 210 shown in FIG. 2 is input to the addition/subtraction determination block 400 which counts an input signal to produce one of signals Add_delay and Sub_delay for adjusting the time delay. The signal Add_delay represents that the time delay is in need of increase and the signal Sub_delay represents that the time delay is in need of decrease. In contrast to the delay control unit shown in FIG. 3, inputs to the reset signal generation block 410 shown in FIG. 4 are the signal Add_delay_i or Sub_delay_i from the comparator 210 and the signal Add_delay or Sub-delay from the addition/subtraction determination block 400. Based on these signals, the reset signal generation block 410 produces a reset signal for initializing the addition/subtraction determination block 400.

The addition/subtraction determination block 400 may be implemented with a counter. Specifically, if the addition signal Add_delay_i is input to the addition/subtraction determination block 400, the addition/subtraction determination block 400 increases the counter by one. Similarly, if the subtraction signal Sub_delay_i is input, the addition/subtraction determination block 400 decreases the counter by one. Thus, the addition/subtraction determination block 400 produces the signal Add_delay if the counted value reaches a first predetermined value, and produces the signal Sub_delay if it reaches a second predetermined value.

The input of the addition signal Add_delay_i and the subtraction signal Sub_delay_i allows the reset signal generation block 410 to reset the addition/subtraction determination block 400 if the addition signal followed by the subtraction signal is input thereto and vice-versa. Specifically, if a continuous number of the addition signal input to the reset signal generation block 410 exceeds a first predetermined number, the reset signal is produced to increase the time delay, and if a continuous number of the subtraction signal input to the reset signal generation block 410 exceeds a second predetermined number, the reset signal is produced to decrease the time delay.

Figure 5:
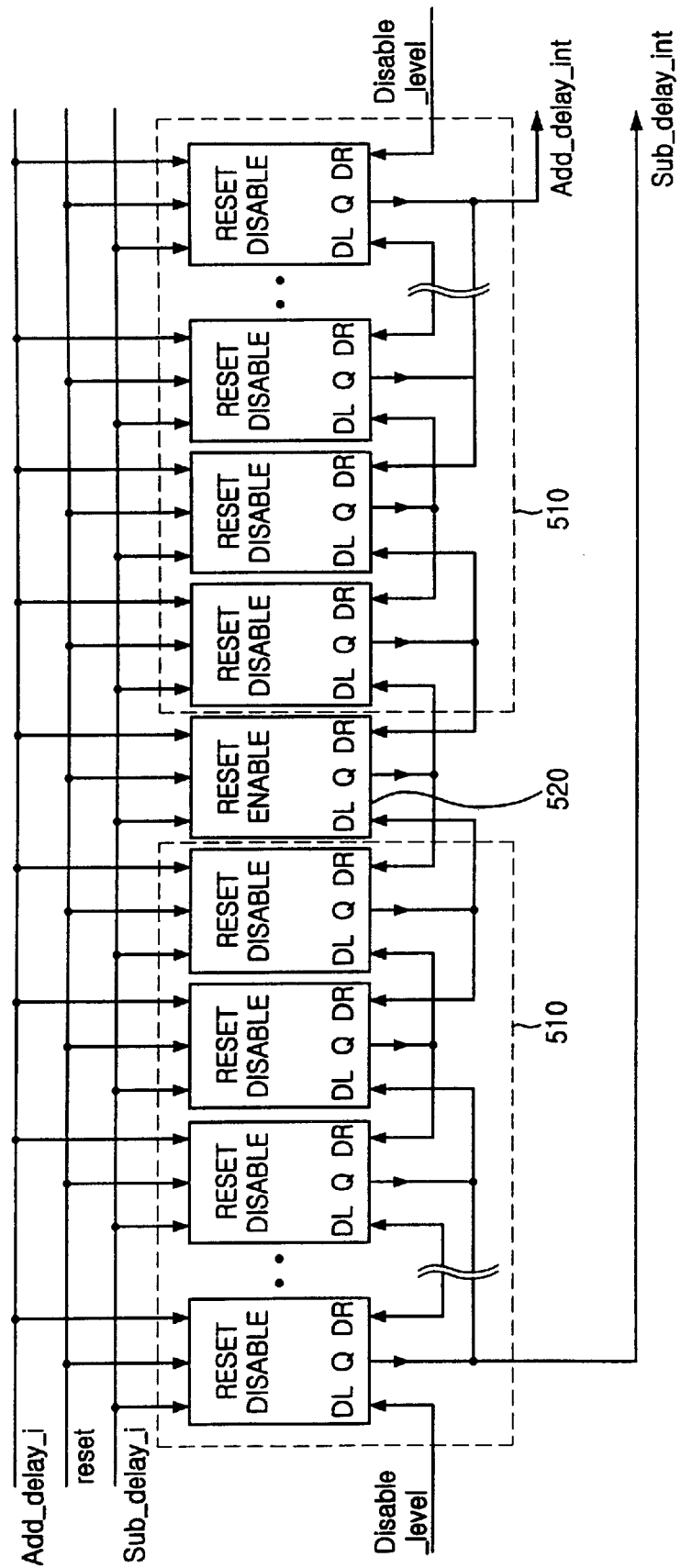
FIG. 5 is a connection diagram illustrating a scheme which implements the addition/subtraction determination block through the use of bi-directional shift registers, in accordance with a preferred embodiment of the present invention.

FIG. 5 is a connection diagram illustrating a scheme which implements the addition/subtraction determination block through the use of bi-directional shift registers, in accordance with a preferred embodiment of the present invention.

In operation, the addition signal Add_delay_i and the subtraction signal Sub_delay_i from the comparator 210 show in FIG. 2, and the reset signal from the reset signal generation block 310 or 410 are input to each of a multiplicity of shift registers which are connected in series. The multiplicity of shift registers is divided into two groups 510 and 530. The one group of shift registers 530 produces an output signal Add_delay_int and the second group of shift registers 510 produces an output signal Sub_delay_int, according to a counted value set by the input signals Add_delay_i and Sub_delay_i. Reset for the shift registers serially connected produces an initial value 1 or 0. In FIG. 5, a plurality of shift registers each having the initial value 0 is placed rightward and leftward of a shift register with the initial value 1. If the reset signal is input to the shift registers, each of the shift registers has a different initial value according to its type.

In FIG. 5, the first group of shift register 510 each being called a reset disable has an initial value set to be low, and a shift register 520 called a reset enable has an initial value set to be high. The output of the shift register 520 with the high state is moved rightward or leftward every occasion the addition signal Add_delay_i or Sub_delay_i is activated. Thereafter, if the shift register with the high state is placed right of the shift register 520, the signal Add_delay_int is output to increase the time delay. On the other hand, if the shift register with the high state id placed left of the shift register 520, the signal Sub_delay_int is output to decrease the time delay. Upon the input of the reset signal, the addition/subtraction determination block 300 or 400 is initialized.

Figure 6:
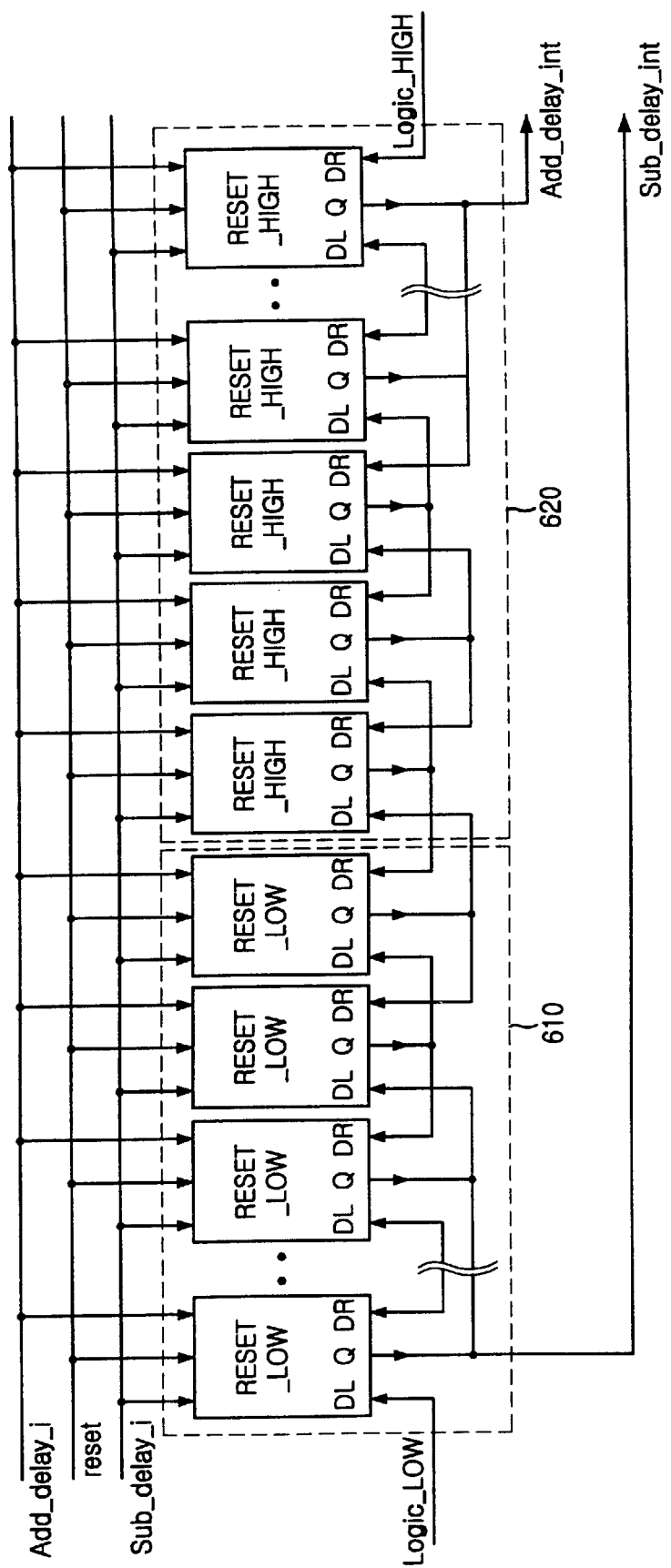
FIG. 6 is a connection diagram illustrating another scheme which implements the addition/subtraction determination block through the use of bi-directional shift registers, in accordance with another preferred embodiment of the present invention.

FIG. 6 is a connection diagram illustrating another scheme which implements the addition/subtraction determination block through the use of bi-directional shift registers, in accordance with another preferred embodiment of the present invention.

In operation, the addition signal Add_delay_i and the subtraction signal Sub_delay_i from the comparator 210 shown in FIG. 2, and the reset signal from the reset signal generation block 410 are inputted to each of a multiplicity of shift registers which are connected in series. The multiplicity of the shift registers is divided into two groups 610 and 620. The first group of the shift registers 620 produces an output signal Add_delay_int and the second group of the shift registers 610 produces an output signal Sub_delay_int, according to a counted value set by the input signals Add_delay_i and Sub_delay_i. Reset for the shift registers serially connected produces an initial value of high or low. In FIG. 6, the first group of shift registers 620 each having the initial value of high is placed right of the second group, and the second group of shift registers 610 each having the initial value of low is placed left of the first group.

The addition/subtraction determination block shown in FIG. 6 is similar to that shown in FIG. 5 except that the first group of the shift registers 620 with an initial value of low and the second group of the shift registers 610 with an initial value of high are arranged in series without intervening any unit there between. That is, passing the values of low and high to the group of the shift registers placed right and left, respectively, produces the output signals Add_delay_int and Sub_delay_int. Accordingly, the addition/subtraction determination block shown in FIG. 6 has a simplified structure in contrast with that shown in FIG. 5.

Figure 7:
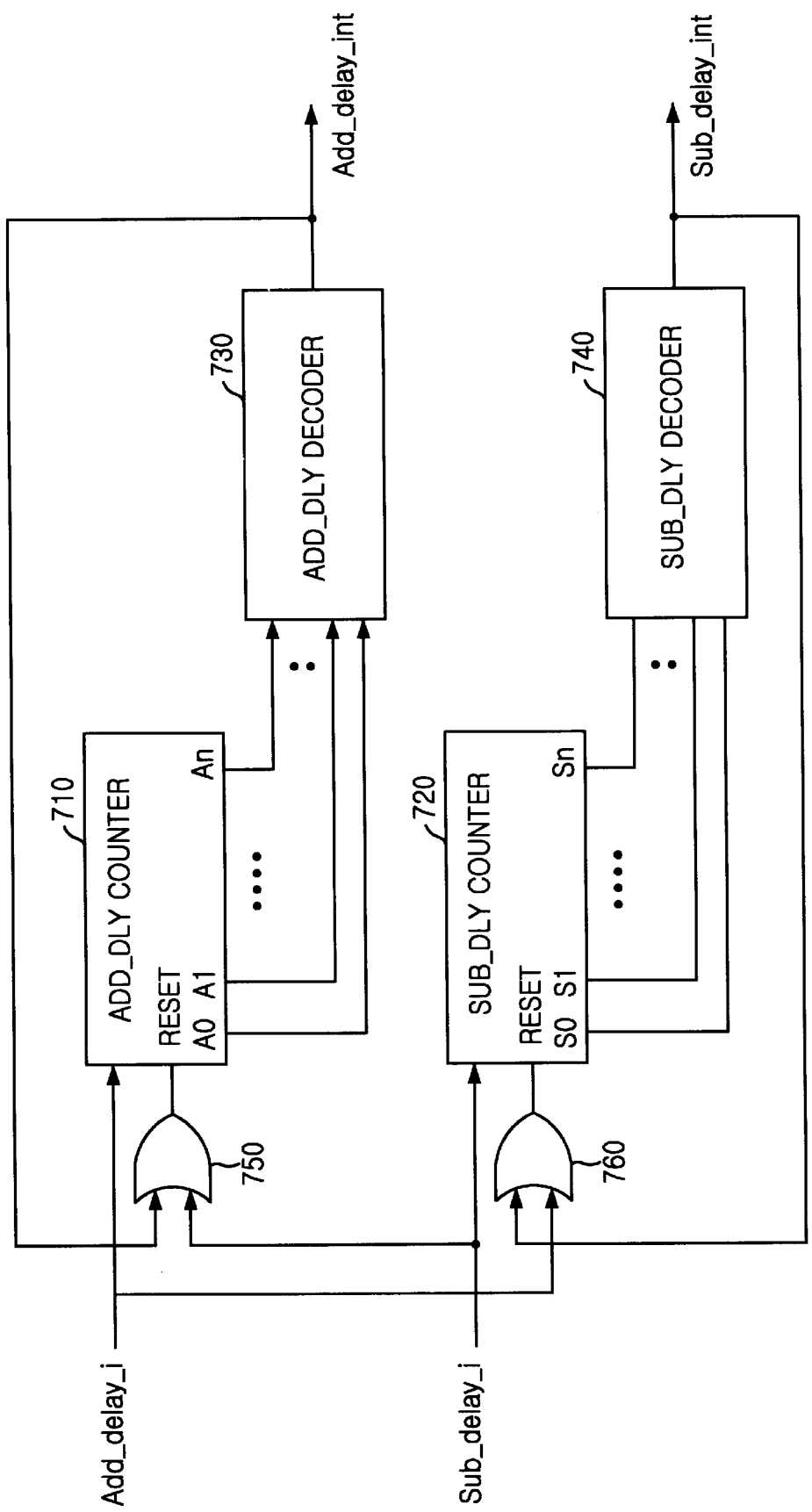
FIG. 7 is a block diagram of the addition/subtraction determination block implemented with a typical counter in accordance with another preferred embodiment of the present invention.

FIG. 7 is a block diagram of the addition/subtraction determination block implemented with a typical counter in accordance with another preferred embodiment of the present invention.

Referring to FIG. 7, the addition/subtraction determination block of the present invention includes an addition delay counter 710, an addition delay decoder 730, a subtraction delay counter 720, a subtraction delay decoder 740, and a first and second OR gate 750 and 760.

The addition delay counter 710 receives the addition signal Add_delay_i from the comparator 210 shown in FIG. 2 and counts the number of occurrences of the received signal to produce a counted value. The addition delay decoder 730 receives the counted value from the addition delay counter 710 and determines if the counted value has reached a first predetermined value. When reached, the addition delay decoder 730 outputs the addition signal Add_delay_int to the controllable delay modification unit 200 shown in FIG. 2. The first OR gate 750 performs an OR operation on the final addition signal Add_delay_int from the addition delay decoder 730 and the subtraction signal Sub_delay_i, to thereby produce a first reset signal for resetting the addition delay counter 710.

The subtraction delay counter 720 receives the subtraction signal Sub_delay_i from the comparator 210 shown in FIG. 2 and counts the number of occurrences of the received signal to produce a counted value. The subtraction delay decoder 740 receives the counted value from the subtraction delay counter 720 and determines if the counted value has reached a second predetermined value. If the counted value has reached the second predetermined value, the subtraction delay decoder 740 outputs the final output signal Sub_delay_int to the controllable delay modification unit 200 shown in FIG. 2. The second OR gate 760 performs an OR operation on the subtraction signal Sub_delay_int from the subtraction delay decoder 740 and the addition signal Add_delay_i, to thereby produce a second reset signal for resettling the subtraction delay counter 720.

There are two cases to reset the addition delay counter 710 as follows: a) when the subtraction signal Sub_delay_i is applied during the consecutive incoming of the addition signal Add_delay_i, and b) when the counted value of the consecutive addition signals exceeds the first predetermined value. Similarly, there are two cases to reset the subtraction delay counter 720 as follows: a) when the addition signal Add_delay_i is applied during the consecutive incoming of the subtraction signal Sub_delay_i, and b) when the counted value of the consecutive subtraction signals exceeds the second predetermined value.

As mentioned above, the present invention employs a delay control unit having the ability to selectively perform an addition and subtraction function on a time delay based on a predetermined condition, to thereby drastically reduce or eliminate a power supply noise, random noise or other irregular noise.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A delay locked loop for use in a semiconductor memory device, which comprises:
   a delay means for delaying a clock signal fed hereto to produce a time delayed signal;
   a comparing means for comparing the time delayed signal from the delay means and a reference signal, determining from the comparison whether an increase or decrease of the time delay is to be requested, and producing a corresponding add request or subtract request signal; and
   a delay control means for counting add request and subtract request signals and providing a control signal to the delay means after the count of add request or subtract request signals reaches a predetermined value, the control signal causing he delay means to increase or decrease the time delay,
   wherein the delay control means includes:
      an addition/subtraction determination means, responsive to the add request and subtract request signals from the comparing means, for generating the control signal that causes the delay means to increase or decease the time delay; and
      a reset signal generation means for producing a reset signal for initializing the addition/subtraction determination means upon providing the control signal to the delay means.

2. The delay locked loop as recited in claim 1, wherein: the reset signal generation means further produces the reset signal for initializing the addition/subtraction determination means when the add request signal followed by the subtract request signal is input thereto or vice-versa.

3. The delay locked loop as recited in claim 1, wherein the addition/subtraction determination means includes:
   a first group of shift registers for receiving the reset signal from the reset signal generation means, thereby rendering an initial value thereof to be low;
   a second group of shift registers for receiving the reset signal from the reset signal generation means, thereby rendering an initial value thereof to be low; and
   a shift register placed between the first and the second groups for receiving the reset signal form the reset generation means, thereby rendering an initial value thereof to be high, for shining a state value of high rightward, hereby allowing the first group of the shift registers to produce a first state of the control signal causing the time delay to be increased, when the add request signal is activated; and for shifting a state value of high leftward, thereby allowing the second group of the shift register to produce a second state of the control signal causing the time delay to be decreased, when the subtract request signal is activated.

4. The delay locked loop as recited in claim 1, wherein the addition/subtraction determination means includes:
   a first group of shift registers for receiving the reset signal from the reset signal generation means, thereby rendering an initial value thereof to be high; and a second group of shift registers for receiving the reset signal from the reset signal generation means, thereby rendering an initial value thereof to be low;

wherein the first group of shift register shifts a state value of high rightward to output a first control signal for allowing the time delay to be increased when the addition signal is activated; and the second group of shift registers shifts a state value of low leftward to output a second control signal for allowing the time delay to be decreased, when the subtraction signal is activated.

5. A delay locked loop, comprising:

a delay means for delaying a clock signal fed thereto to produce a time-delayed signal;

a comparing means for comparing the time-delayed signal from the delay means and a reference signal, determining from the comparison whether an increase or decrease of the time delay is to be requested, and producing a corresponding add request or subtract request signal; and a delay control means for counting add request and subtract request signals and providing a control signal to the delay means after the counted value reaches a predetermined value, the control signal causing the delay means to increase or decrease the time delay, wherein the delay control means includes:

an addition delay counter for receiving the add request signal from the comparing means and counting add request signals to produce a first counted value;

an addition delay decoder for receiving the first counted value from the addition delay counter, determining whether the first counted value has reached a first predetermined value, and outputting a first control signal for allowing the time delay to be increased, when reached;

a first reset means for performing a combination operation on the first control signal and the subtract request signal, to thereby produce a tint reset signal for resetting the addition delay counter;

a subtraction delay counter for receiving the subtract request signal from the comparing means and counting subtract request signals to produce a second counted value;

a subtraction delay decoder for receiving the second counted value from the subtraction delay counter, determining whether the second counted value has reached a second predetermined value, and outputting a second control signal for allowing the time delay to be decreased, when reached; and a second reset means for performing a combination operation on the second control signal and the add request signal, to thereby produce a second reset signal for resetting the subtraction delay counter.

6. The delay locked loop as recited in claim 5, wherein each of the first and second reset means includes an OR gate.

7. A delay locked loop comprising:

a delay unit coupled to receive an external clock signal and to generate a time-delayed clock signal, the time delay being adjustable in response to a delay control signal;

a comparator coupled to receive the time-delayed clock signal from the delay unit and configured to compare the time-delayed clock signal with a reference signal, and to generate either of an add request signal and a subtract request signal based on the comparison; and a delay control unit coupled to receive the add request and subtract request signals and to provide the delay control signal to the delay unit, the delay control unit being configured to generate the delay control signal after a count of add request or subtract request signals reaches a predetermined number, wherein the delay control unit includes:

a control signal generator configured to maintain a count of received add request and subtract request signals and to generate the delay control signal; and a reset generator configured to reset the control signal generator to an initial state when the delay control sign is generated.

8. The delay locked loop of claim 7, wherein the control signal generator comprises:

a counter coupled to receive add request and subtract request signals, the counter configured to increment a count value when an add request signal is received, to decrement the count value when a subtract request signal is received, and to reset the count value when the reset generator resets the control signal generator; and an output generator coupled to receive the count value from the counter, the output generator configured to generate the delay control signal in a first state when the count value exceeds a first threshold and to generate the delay control signal in a second state when the count value is below a second threshold.

9. The delay locked loop of claim 7, wherein the reset generator is flanker configured to reset the control signal generator when a received add request signal is followed by a received subtract request signal or when a received subtract request signal is followed by a received add request signal.

10. The delay locked loop of claim 7, wherein the delay control signal is generated from:

an add delay signal that causes the delay unit to increase the time delay of the time-delayed clock signal; and a subtract delay signal that causes the delay unit to decrease the time delay of the time-delayed clock signal.

11. The delay locked loop of claim 10, wherein the delay control unit comprises:

a reset signal generator coupled to receive the delay control signal and to generate a reset signal in response thereto;

a first chain of serially-connected bi-directional shift registers, each shift register in the first chain configured to output a logic low value in response to the reset signal, the first chain including a first output shift register at one end configured to output the subtract delay signal and a first input shift register at an opposite end;

a second chain of serially-connected bi-directional shift registers, each shift register in the second chain configured to output a logic low value when the reset signal is received, the second chain including a second output shift register at one end configured to output the add delay signal and a second input shift register at an opposite end; and a reset-high bi-directional shift register connected between the first input shift register and the second input shift register, the reset-high shift register configured to output a logic high value in response to the reset signal, wherein, in response to the add request signal, data in the shift registers is shifted toward the first output shift register and in response to the subtract request signal, data in the shift registers is shifted toward the second output register.

12. The delay locked loop of claim 10, wherein the delay control unit comprises:

a reset signal generator coupled to receive the first delay control signal and to generate a reset signal in response thereto;

a first chain of serially-connected bi-directional shift registers, each shift register in the first chain configured to output a logic low value in response to the reset signal, the first chain including a first output shift register at one end configured to output the subtract delay signal and a first input shift register at an opposite end; and a second chain of serially-connected bi-directional shift registers, each shift register in the second chain configured to output a logic high value in response to the reset signal, the second chain including a second output shift register at one end configured to output the add delay signal and a second input shift register at an opposite end connected to the first input shift register, wherein in response to the subtract request signal, data in the shift registers is shifted toward the first output shift register and in response to the add request signal, data in the shift registers is shifted toward the second output shift register.

13. The delay locked loop of claim 10, wherein the delay control unit comprises:

an add delay counter coupled to receive the add request signal and a first reset signal, the add delay counter configured to increment a first count value in response to the add request signal and to reset the first count value in response to the first reset signal;

an add delay decoder coupled to receive the first count value from the add delay counter and configured to compare the first count value to a first predetermined value and to output the add delay signal when the first count value exceeds the first predetermined value;

a subtract delay counter coupled to receive the subtract request signal and a second reset signal, the subtract delay counter configured to increment a second count value in response to the subtract request signal and to reset the second count value in response to the second reset signal;

a subtract delay decoder coupled to receive the second count value from the subtract delay counter and configured to compare the second count value to a second predetermined value and to output the subtract delay signal when the second count value exceeds the second predetermined value;

a first reset signal generator coupled to receive the subtract request signal and the add delay signal and to provide the first reset signal to the add delay counter, the first reset signal generator configured to generate the first reset signal when either of the add delay signal and the subtract request signal is received; and a second reset signal generator coupled to receive the add request signal and the subtract delay signal and to provide the second reset signal to the subtract delay counter, the second reset signal generator configured to generate the second reset signal when either of the subtract delay signal and the add request signal is received.

14. The delay locked loop of claim 13, wherein each of the first and second reset signal generators includes an OR gate.

15. A method for adjusting a time delay of a delay locked loop, the method comprising:

comparing a time-delayed signal output from the delay locked loop with a reference signal to determine whether the time delay needs to be increased or decreased;

generating an add request in response to a determination that the time delay needs to be increased;

generating a subtract request in response to a determination that the time delay needs to be decreased;

counting add requests and subtract. requests until the count of add requests or subtract requests reaches a predetermined number;

increasing the time delay after the count of add requests reaches the predetermined number;

decreasing the time delay after the count of subtract requests reaches the predetermined number; and resetting the count of add requests and subtract requests Upon increasing or decreasing the time delay.

16. The method of claim 15, wherein counting add requests and subtract requests until the count of add requests or subtract requests reaches a predetermined number comprises:

incrementing a count value in response to an add request;

decrementing the count value in response to a subtract request;

determining whether the count value is larger than an add threshold;

in response to a determination that the count value is larger than the add threshold, performing the following acts:

generating a first signal indicating that the count of add requests has reached the predetermined number; and resetting the count value to a starting value;

determining whether the count value is smaller than a subtract threshold; and in response to a determination that the count value is smaller than the subtract threshold, performing the following acts:

generating a second signal indicating that the count of subtract requests has reached the predetermined number; and resetting the count value to the staring value.

17. The method of claim 16, further comprising:

resetting the count value when an add request is followed by a subtract request; and resetting the count value when a subtract request is followed by an add request.

18. The method of claim 15, wherein counting add requests and subtract requests comprises:

storing a logic high value in a starting bi-directional shift register within a series of bi-directional shift registers, tie series having a first end shift register and a second end shift register;

shifting the logic high value toward the first end shift register in response to an add request; and shifting the logic high value toward the second end shift register in response to a subtract request, wherein the count of add requests reaches the predetermined number when the logic high value reaches he first end shift register and the count of subtract requests reaches the predetermined number when the logic high value reaches the second end shift register.

19. the method of claim 15, wherein counting add requests and subtract requests comprises:

storing a logic high value in each of a first plurality of serially-connected bi-directional shift registers, the first plurality of shift registers having a first end shift register;

storing a logic low value in each of a second plurality of serially-connected bi-directional shift registers, the second plurality of shift registers having a second end shift register and being connected to the first plurality of shift registers to form a series of shift registers between the fist end shift register and the second end shift register;

shifting the stored data value in the series of shift registers toward the first end shift register in response to an add request; and shifting the stored data value in the series of shift registers toward the second end shift register in response to an add request, wherein the count of add requests reaches the predetermined number when the logic low value reaches the first end shift register and the count of subtract requests reaches the predetermined number when the logic high value reaches the second end shift register.

20. The method of claim 15, wherein counting add requests and subtract requests comprises:

in response to an add request:
incrementing a first count value;
resetting a second count value to a start value; and
determining whether the first count value has reached the predetermined number; and in response to a subtract request:
incrementing the second count value;
resetting the first count value to the start value; and
determining whether the second count value has reached the predetermined number.

* * * * *